US010805130B2

(12) United States Patent
Shakedd et al.

(10) Patent No.: US 10,805,130 B2
(45) Date of Patent: Oct. 13, 2020

(54) SIGNAL CANCELLATION SYSTEM AND METHOD

(71) Applicant: Intel IP Corporation, Santa Clara, CA (US)

(72) Inventors: Lior Shakedd, Kfar Bilu (IL); Avi Sulimarski, Kfar Oranim (IL); Sarit Zur, Petah-Tikva (IL); Oren Ezra Avrham, Herzlia (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/127,558

(22) Filed: Sep. 11, 2018

(65) Prior Publication Data

US 2019/0081831 A1 Mar. 14, 2019

Related U.S. Application Data

(60) Provisional application No. 62/557,379, filed on Sep. 12, 2017.

(51) Int. Cl.
*H04L 27/06* (2006.01)
*H04L 27/22* (2006.01)
(Continued)

(52) U.S. Cl.
CPC ............. *H04L 27/22* (2013.01); *H03D 3/002* (2013.01); *H03D 3/007* (2013.01); *H03D 7/165* (2013.01);
(Continued)

(58) Field of Classification Search
CPC .. H04L 27/22; H04B 1/16; H04B 1/00; H04B 1/123; H03D 7/165; H03D 3/002;
(Continued)

(56) References Cited

U.S. PATENT DOCUMENTS 8,498,591 B1 7/2013 Qian et al.
9,054,925 B1 * 6/2015 Madoglio ............... H04L 27/22
(Continued)

FOREIGN PATENT DOCUMENTS

WO 2005027342 A1 3/2005

OTHER PUBLICATIONS

European Search Report dated Dec. 8, 2017 in connection with European Application No. EP 17 17 0666.
(Continued)

*Primary Examiner* — Tesfaldet Bocure
(74) *Attorney, Agent, or Firm* — Viering, Jentschura & Partner mbb (57) ABSTRACT

Systems, methods, and circuitries are disclosed for generating a desired signal from a received signal. In one example a signal cancellation system includes local oscillator (LO) downconverter circuitry, frequency offset (FO) signal estimation circuitry, and cancellation circuitry. The LO downconverter is configured to downconvert the received signal using an LO signal having an LO frequency to generate a downconverted received signal. The FO signal estimation circuitry includes FOLO generation circuitry configured to modify the LO signal to generate a FOLO signal having an offset frequency that is different from the LO frequency and FOLO downconverter circuitry configured to use the FOLO signal to downconvert a signal derived from the received signal to generate a downconverted FO signal. The cancellation circuitry is configured to cancel either the downconverted received signal or the downconverted FO signal from the received signal to generate the desired signal.

16 Claims, 6 Drawing Sheets

(51) Int. Cl.
*H04B 1/16* (2006.01)
*H03D 3/00* (2006.01)
*H04B 1/00* (2006.01)
*H03D 7/16* (2006.01)
*H04B 1/12* (2006.01)

(52) U.S. Cl.
CPC .............. *H04B 1/00* (2013.01); *H04B 1/123* (2013.01); *H04B 1/16* (2013.01); *H03D 2200/0088* (2013.01)

(58) Field of Classification Search
CPC ........ H03D 3/009; H03D 3/008; H03D 3/007; H03D 2200/0088
USPC ................................. 375/285, 316, 340, 346
See application file for complete search history.

(56) References Cited

U.S. PATENT DOCUMENTS

| | | | |
|---|---|---|---|
| 10,142,040 B2 * | 11/2018 | Dias ...................... | H04B 17/21 |
| 2002/0072344 A1 | 6/2002 | Souissi | |
| 2008/0159435 A1 | 7/2008 | Cohen | |
| 2012/0051409 A1 | 3/2012 | Brobston et al. | |
| 2012/0214421 A1 | 8/2012 | Hoirup et al. | |
| 2013/0027129 A1 | 1/2013 | Langer | |
| 2013/0141167 A1 | 6/2013 | Kim et al. | |
| 2013/0169359 A1 | 7/2013 | Coumou | |
| 2013/0272175 A1 | 10/2013 | Zargari et al. | |
| 2014/0177761 A1 | 6/2014 | Patel et al. | |
| 2014/0210683 A1 | 7/2014 | Aryanfar et al. | |
| 2014/0213196 A1 | 7/2014 | Langer et al. | |
| 2014/0269863 A1 | 9/2014 | Fan et al. | |
| 2014/0355456 A1 | 12/2014 | Jiang et al. | |
| 2014/0370823 A1 | 12/2014 | Yu | |
| 2015/0030102 A1 | 1/2015 | Hormis et al. | |
| 2015/0156044 A1 * | 6/2015 | Madoglio ............... | H04L 27/20 375/219 |
| 2015/0181643 A1 * | 6/2015 | Lakdawala .............. | H04B 7/06 375/299 |
| 2015/0195050 A1 | 7/2015 | Kim et al. | |
| 2015/0372644 A1 | 12/2015 | Boos et al. | |
| 2016/0149652 A1 | 5/2016 | Huang et al. | |
| 2016/0173030 A1 | 6/2016 | Langer et al. | |
| 2016/0359614 A1 | 12/2016 | Hao et al. | |

OTHER PUBLICATIONS

European Search Report dated Mar. 2, 2017 in connection with European Application No. EP 16 18 9905.
International Search Report dated Nov. 14, 2017 in connection with International Application No. PCT/US2017/044784.
European Search Report dated Mar. 27, 2017 in connection with European Application No. EP 16 18 9910.
International Search Report dated Nov. 10, 2017 in connection with International Application No. PCT/US2017/044783.
European Search Report dated Mar. 3, 2017 in connection with European Application No. EP 16 18 9900.
Casaleiro, J., et al., "A Quadrature RC-Oscillator With Capacitive Coupling", Integration, The VLSI Journal, vol. 52, Jun. 26, 2015, pp. 260-271, XP029329970.
Kim, M., et al., "Parametric Method of Frequency-Dependent I/Q Imbalance Compensation for Wideband Quadrature Modulator", IEEE Transactions On Microwave Theory and Techniques, vol. 61, No. 1, Jan. 1, 2013, pp. 270-280, XP011488083.
Kirei, B. S., et al., "Blind Frequency-Selective I/Q Mismatch Compensation Using Subband Processing", IEEE TRansactions on Circuits and Systems, vol. 59, No. 5, May 1, 2012, XP011444097.
Y. Wang, et al., "System Simulation of Adaptive I/Q Mismatch Compensation Method Using SystemC-AMS", PH. D. Research in Microelectronics and Electronics (Prime), Jul. 18, 2010, pp. 1-4, XP031764365.
Windisch, M., et al., "Adaptive I/Q Imbalance Compensation In Low-IF Transmitter Architectures", 2004 IEEE 60th Vehicular Technology Conference, vol. 3, Sep. 26, 2004, pp. 2096-2100, XP01 0787009.
European Search Report dated Feb. 28, 2017 in connection with European Application No. EP 16 18 5768.
Non Final Office Action dated Nov. 18, 2016 in connection with U.S. Appl. No. 14/869,023.

* cited by examiner

SIGNAL CANCELLATION SYSTEM AND METHOD

CROSS-REFERENCE TO RELATED APPLICATIONS

This application claims benefit of priority U.S. Provisional Patent Application Ser. No. 62/557,379, filed Sep. 12, 2017 titled INTERFERENCE CANCELLATION SYSTEM AND METHOD by the same inventors of the subject application and all fully incorporated herein by their reference.

BACKGROUND

A Phase locked loop (PLL) can be used to generate a local oscillator (LO) signal for upconverting or downconverting signals in a transmit or receive chain. The LO signal has a selected frequency that aligns with a center frequency of the transmitted/received signal that is being upconverted or downconverted. The transmitted/received signal also has signal components (e.g., noise, interference, signals intended for other devices) at frequencies different from the center frequency.

DETAILED DESCRIPTION

In signal processing systems it is often desirable to cancel signal components at a given frequency from a received signal to isolate a desired signal component at a different frequency. Separate PLLs could be used to generate separate LO signals for downconverting the received signal to isolate the signal components at the different frequencies. However, using more than one PLL incurs considerable increase in area, cost, and power consumption. Further, simultaneous operation of the PLLs would create spurious artifacts and also unwanted pulling effects between the PLLs.

Described herein are systems, circuitries, and methods in which a frequency offset (FO) LO signal having an offset frequency (with respect to the LO signal frequency) is generated from the LO signal. The FOLO signal can then be used to downconvert the received signal to isolate signal components at the offset frequency without the need for a second PLL generating an LO signal at the offset frequency. This allows for effective signal component isolation and cancelling without assumptions about the signal component at the offset frequency.

Reciprocal mixing is one type of interference that can be addressed by isolating and cancelling signal components occurring at different frequencies from a received signal. Reciprocal mixing (RM) occurs in a receive chain when an unwanted radio frequency (RF) signal occurring at a frequency that is offset from a desired frequency is downconverted to the baseband (BB) frequency by out-of-bandwidth (BW) LO Phase Noise (PN) on top of the desired signal. This severely degrades the BB signal quality. Reciprocal mixing occurs both during normal operation of the receiver and also during loopback (LPBK)-aided calibration of the receiver. During normal receiver operation (denoted "RX"), reciprocal mixing occurs when a strong blocker signal is present at the antenna input at frequencies outside the bandwidth of the desired signal components, which are centered at the LO frequency. During LPBK-aided calibration with frequency offset (denoted "LPBK") the receiver tries to isolate a distortion signal (hereinafter "out-of-band" signal) at frequencies that are outside the bandwidth of the fundamental signal, which is centered at the LO frequency. In this case, the fundamental signal acts as a blocker signal that may be downconverted to BB on top of the out-of-band signal. Thus, during calibration, it is desirable to cancel the fundamental signal from the loopback signal while keeping the out-of-band signal.

Known solutions to reciprocal mixing are based on rigorous and challenging RF design, which guarantees excellent synthesizer out-of-BW PN performance (to reduce RM level in the first place). This RF approach has several drawbacks. RF simulations do not predict the silicon behavior very well in this aspect, which leads to additional tape-outs and longer integration time. Further, the achievable performance is limited, since there would always be a considerable level of out-of-BW PN, which would introduce RM artifacts and degrade RX/LPBK performance. The achievable performance is also limited, for example by LPBK non-linearity, which would introduce interference-related undesired artifacts and degrade LPBK performance. Finally, such efforts also complicate the RF design, increase power consumption and require higher resources and design & verification time.

Figure 1:
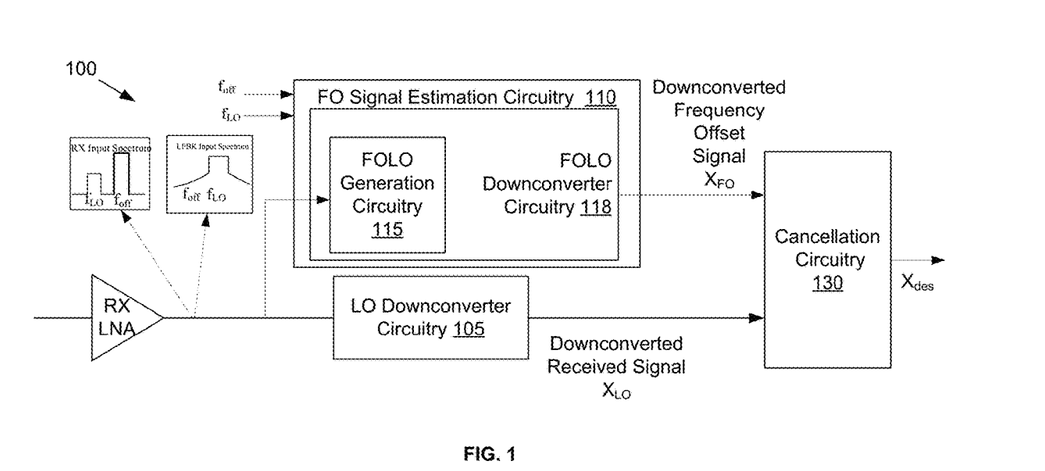
FIG. 1 illustrates an exemplary signal cancellation system that generates a desired signal in accordance with various aspects described.

FIG. 1 illustrates a receiver chain that includes a signal cancellation system 100. The system 100 includes a dedicated RF RX path that includes an LO downconverter circuitry 105, a frequency offset (FO) signal estimation circuitry 110, and cancellation circuitry 130. The LO downconverter circuitry 105 is configured to downconvert the received signal using an LO signal having an LO frequency to generate a downconverted received signal $X_{LO}$. The FO signal estimation circuitry 110 includes FOLO generation circuitry 115 and FOLO downconverter circuitry 118. The FOLO generation circuitry 115 modifies the LO signal to generate a FOLO signal having an offset frequency that is different from the LO frequency. In one example the FOLO generation circuitry 115 includes a digital-to-time converter (DTC)) that is used to generate the FOLO signal from the LO signal. The FOLO downconverter circuitry 118 uses the FOLO signal to downconvert a signal derived from the received signal to generate a downconverted FO signal $X_{FO}$.

In RX mode, the cancellation circuitry 130 cancels the downconverted received signal $X_{LO}$ from the received signal to cancel the effects of RM. In loopback calibration mode, the cancellation circuitry 130 cancels the downconverted received signal from the received signal to generate an "out-of-band signal" from which in-band components at the LO frequency have been cancelled (thereby isolating the noise in the calibration signal).

Reciprocal Mixing Cancellation During RX operation

Figure 2:
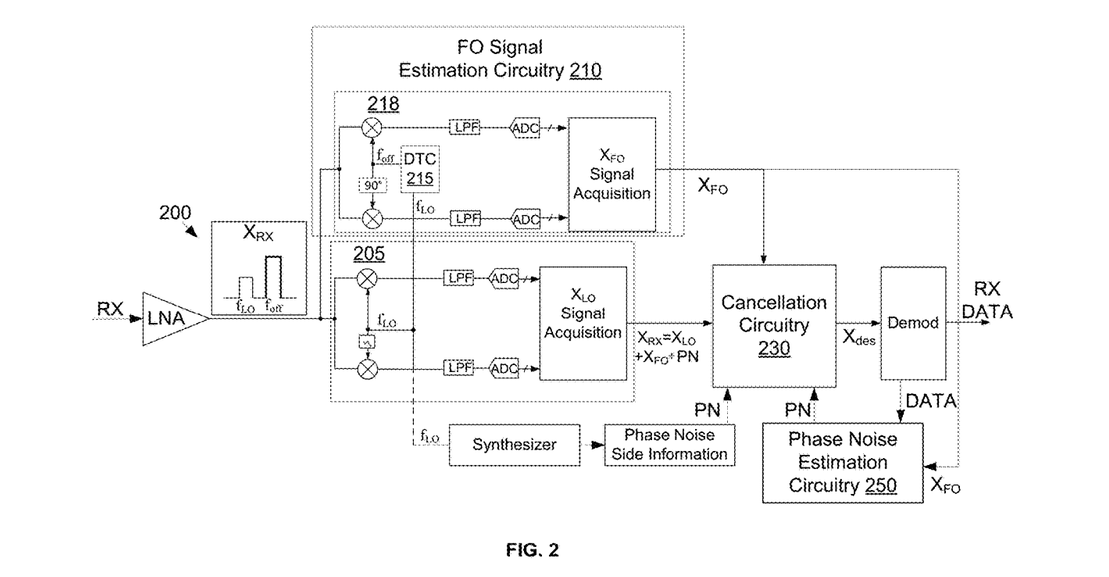
FIG. 2 illustrates an exemplary signal cancellation system that cancels a frequency offset (FO) signal from a received signal to generate a desired signal in accordance with various aspects described.

FIG. 2 illustrates a transceiver architecture that includes an example signal cancellation system 200 in a receiver chain. The signal cancellation system 200 includes LO downconverter circuitry 205, FO signal estimation circuitry 210, cancellation circuitry 230, and phase noise estimation circuitry 250. During RX operation two signals are present at the RX antenna input: the desired signal ($X_{LO}$) at the receiver chain's LO frequency $f_{LO}$ and a blocker signal (e.g., undesired signal) ($X_{FO}$)) at a blocker frequency $f_{off}$ that is offset from the LO frequency. $X_{FO}$ can originate from another wireless/cellular communication device, for example a wireless fidelity/long term evolution/Bluetooth (WiFi/LTE/BT) device. Modern receivers experience high power blockers due to congested spectral environments which are characteristics in today's reality. The RM caused by high power blockers degrades the receiver's performance, which can be expressed as the receiver's error vector magnitude (RX EVM) or throughput.

The FO estimation circuitry 210 generates an estimate of the blocker signal $X_{FO}$ using a dedicated RF RX path. The FO estimation circuitry includes a DTC 215 (FOLO generation circuitry) that offsets the LO frequency to generate the FOLO signal. To offset the LO frequency to generate the FOLO frequency, a ramp phase modulation input is provided to the DTC that will cause the DTC to selectively delay the LO signal to shift the frequency of the LO signal to the desired offset frequency. The DTC modulates the phase of the LO signal, hence by applying a phase ramp, the DTC outputs a frequency-shifted version of the LO (this can be regarded as a type of Frequency Modulation, where the slope of the phase ramp determines the frequency offset). Note that FOLO generation circuitry/DTC 215 does not rely on a second PLL to generate the FOLO signal. FOLO downconverter circuitry 218 uses the FOLO signal output by the DTC to downconvert the received signal so that the blocker signal is down-converted to BB frequency. The resulting signal, $X_{FO}$, provides an excellent estimate of the blocker signal.

LO downconverter circuitry 205 downconverts the received signal XRX with the receiver chain's LO signal which has the frequency $f_{LO}$. The signal output by the LO downconverter circuitry includes the downconverted received signal $X_{LO}$ (resulting from the received signal components at $f_{LO}$) as well as the blocker signal which corresponds to the blocker signal $X_{FO}$ (which is estimated by FO signal estimation circuitry 210) convolved with RM phase noise (PN) in the receiver chain. The cancellation circuitry 230 is configured to generate a cancellation signal that cancels the blocker signal $X_{FO}*PN$ from the received signal $X_{RX}$. The cancellation circuitry 230 receives a value for PN for use in determining the cancellation signal. In one example, shown in dashed line in FIG. 2, side information from a synthesizer phase detector output may be used to determine the value for PN.

In another example, the phase noise estimation circuitry 250 uses a decision directed algorithm to reach a good estimate of the RM PN. In the main RX digital path, the cancellation signal ($X_{FO}*PN$) is subtracted from the downconverted received signal by RM cancellation circuitry 230, thus cancelling it, and providing a RM-free version of the desired signal. This provides excellent RM cancellation without the addition of a dedicated PLL and without assuming the interference signal data is known to the system.

Figure 2A:
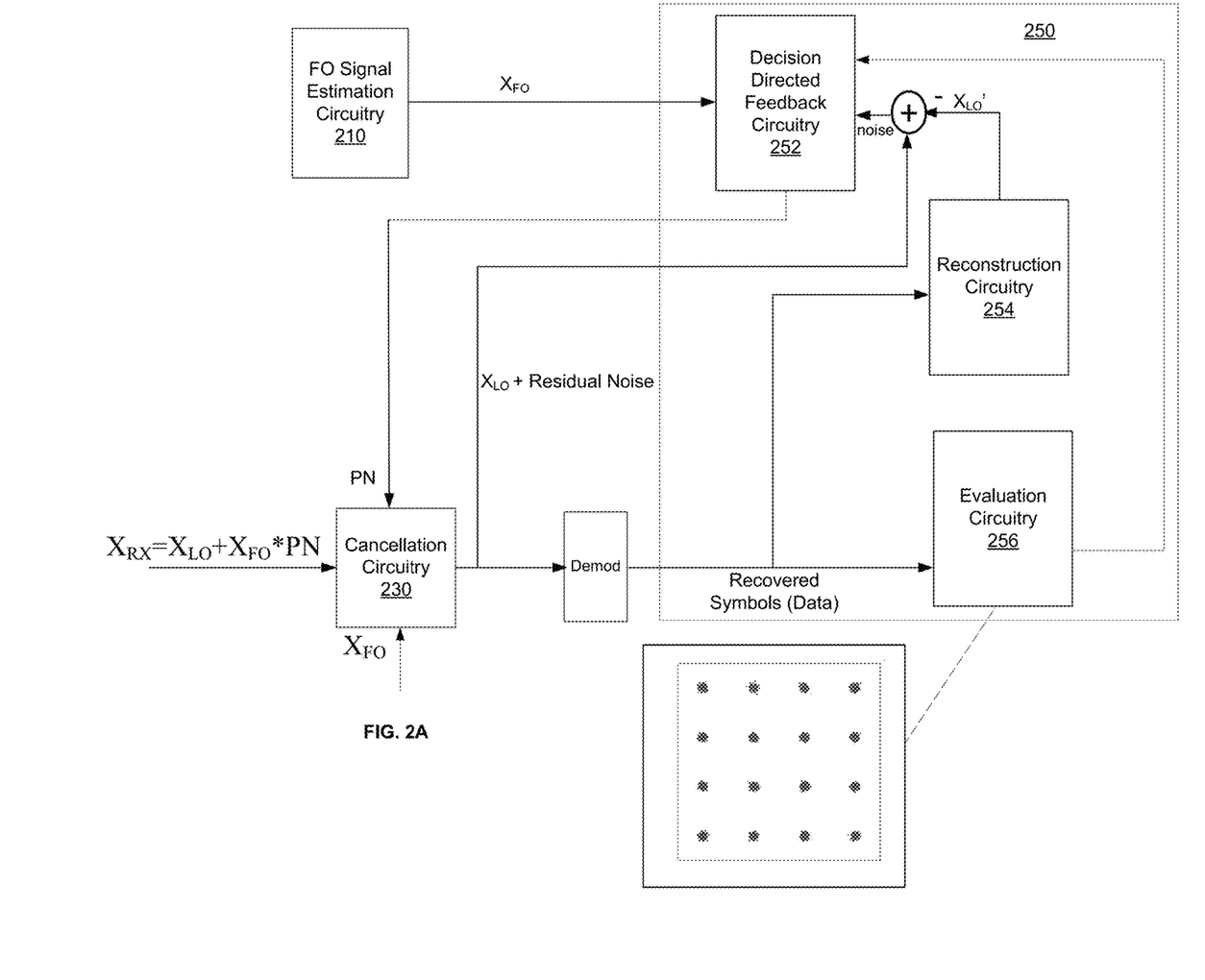
FIG. 2A illustrates an exemplary signal cancellation system that cancels a frequency offset (FO) signal from a received signal based on an estimated phase noise to generate a desired signal in accordance with various aspects described.

FIG. 2A illustrates an example phase estimation circuitry 250 that receives the downconverted FO signal $X_{FO}$ from the FO signal estimation circuitry 210. The phase estimation circuitry 250 also receives the output of the cancellation circuitry 230 which includes the desired signal $X_{LO}$ as well as any remaining uncancelled noise corresponding to $X_{FO}*PN$. The phase estimation circuitry 250 iteratively changes the value of PN until the uncancelled noise is sufficiently diminished.

Assuming that the spectrum of an ideal received OFDM signal and an interferer with a wide-band Reciprocal Mixing PN skirt, the phase noise skirt of the interferer would limit the received EVM of the desired signal. When a strong interferer appears in the link the BB filter only removes the main signal itself, while the phase noise skirt which appears in the desired frequency is not impacted. This results in a noise that can be seen in the time-domain signals. However, even in this case, when the SNR of the RM-impacted signal is good enough, a probabilistic receiver (such as ML using LLR's) can provide a good estimate of the original signal. In such a case, an ideal received signal can be reconstructed and subtracted from the actual received signal, and the noise signal that impacted it can thereby be measured. A significant part of this noise results from the phase noise added by the strong interferer, but the actual interferer is measured through the auxiliary RX RF path. This means that the phase noise estimation circuitry 250 can employ an iterative loop as follows.

First, the cancellation circuitry 230 measures the received signal for a given OFDM symbol. Then decision directed feedback circuitry 252 measures the undesired signal (at the known offset frequency $f_{off}$) for the same time period. The cancellation circuitry 230 subtracts the FO signal from the received signal (after applying the relevant filtering). The corrected received signal is demodulated and EVM of the recovered symbols is measured by the evaluation circuitry 256. An ideal (time domain) received signal $X_{LO}$' is reconstructed by reconstruction circuitry 254 using the demodulation result. The ideal received signal $X_{LO}$' is subtracted from the corrected received signal output by the cancellation circuitry 230, giving a noise estimation. Decision directed feedback circuitry 252 calculates an assumed PN contribution that the interferer could have caused in this scenario (approximated by $|Interf| \cdot e^{j \cdot arg(Interf+Noise)}$). The cancellation circuitry 230 uses the calculated PN to determine a revised estimated blocker signal and subtracts the revised blocker signal from the received RX signal. The output of the cancellation circuitry 230 (e.g., the desired signal $X_{LO}$, $X_{FO}*PN$) is demodulated and the iterations of PN continue until the EVM meets a desired optimization goal.

Interference Cancellation during Loopback-Aided Calibration

When calibrating nonlinear effects using LPBK, the distortion artifacts can reside very far from the fundamental signal on the frequency axis. For example, DTC INL causes ultra-wide-band (e.g. 600 MHz!) nonlinear effects due to PM/PM (static and dynamic). Since a LPBK with an observation BW of ~600 MHz at BB and sufficient dynamic range is not feasible, an offset down conversion LPBK can be used. This results in an analogous scenario as the RX operation use case described above with reference to FIG. 2. However, in the LPBK use case the nonlinearity artifact (e.g. out-of-band signal) is considered to be the desired signal and the fundamental signal (e.g., $X_{LO}$ resulting from downconversion using the signal from the synthesizer or PLL) is considered to be the blocker signal to be cancelled from the received signal to generate the out-of-band signal that will be used for calibration.

Figure 3:
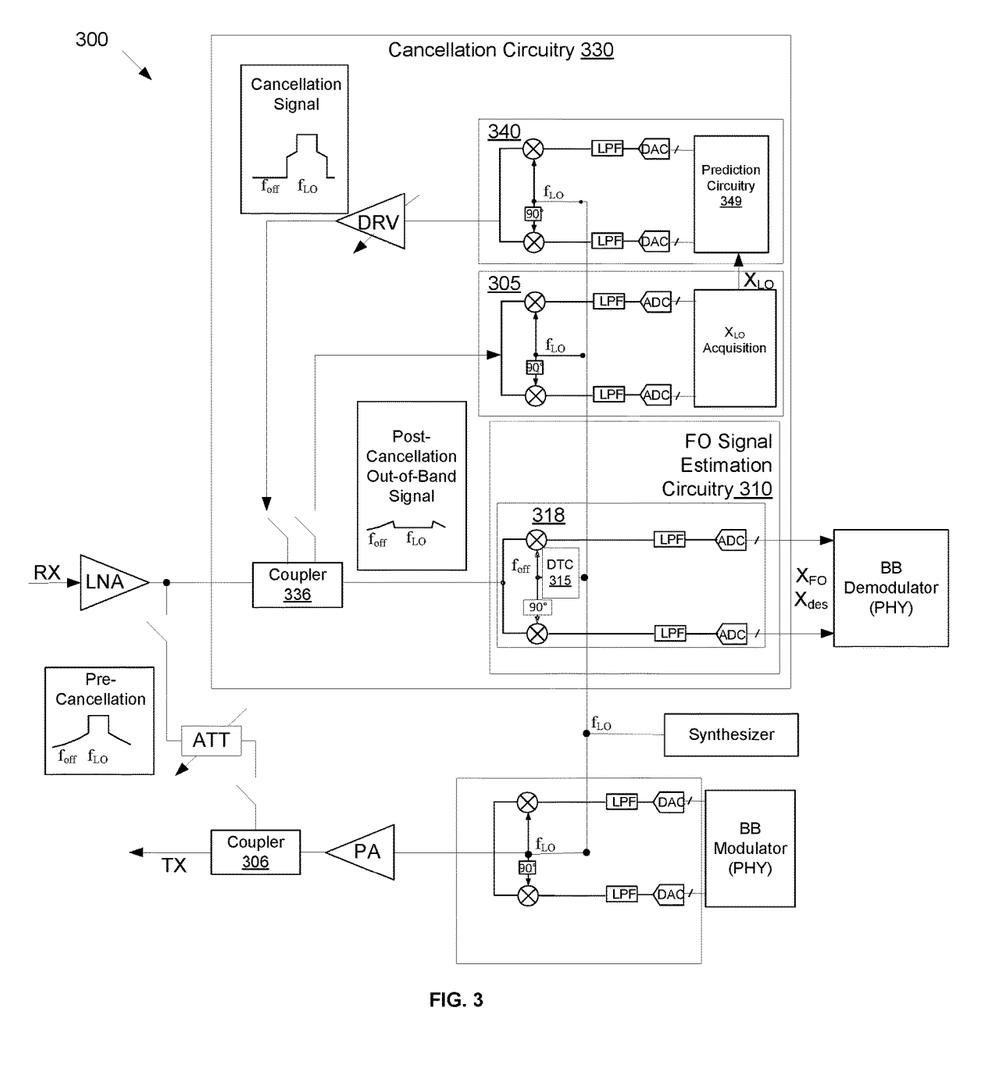
FIG. 3 illustrates an exemplary signal cancellation system that cancels a downconverted received signal from a received signal to generate an out-of-band signal during loopback aided calibration in accordance with various aspects described.

FIG. 3 illustrates a transceiver architecture that includes an example signal cancellation system 300 for LPBK calibration in a receiver chain. The input signal looped back from the TX chain is shown as the "pre-cancellation" signal which has a significant signal component at the LO frequency and out-of-band signal components at the offset frequency. Recall that during LPBK calibration, it is desirable to cancel the downconverted received signal $X_{LO}$ from the received signal to estimate the out-of-band signal that corresponds to noise in the signal looped back from the TX chain. The signal cancellation system includes LO downconverter circuitry 305, FO signal estimation circuitry 310, cancellation circuitry 330, and alignment circuitry 340. The cancellation circuitry 330 includes a coupler 336 that injects a cancellation signal output by the alignment circuitry 340 into the received signal to generate the out-of-band signal. The cancellation signal should be identical in magnitude and have inverted phase with respect to the received signal components at the LO frequency.

To generate the cancellation signal, the LO downconverter 305 downconverts the received signal using the LO signal to generate the downconverted received signal $X_{LO}$. The alignment circuitry 340 modifies the downconverted received signal $X_{LO}$ generated by the LO downconverter circuitry 305 to compensate for the effects the RX/TX chains associated with the signal cancellation system 300 cause in the received signal. The alignment circuitry 340 adjusts the magnitude of the interference signal via digital/BB/RF gain control. The alignment circuitry 340 generates a phase adjustment control signal that adjusts the phase of the downconverted receive signal $X_{LO}$ using a digital phase adjustment to achieve 180° compared to the downconverted receive signal $X_{LO}$ signal at the injection point.

Prediction circuitry 349 measures the time delay within the LPBK and moves the downconverted received signal $X_{LO}$ forward in time to the appropriate time (i.e., negative delay). The gain, phase, and time delay of the RX/TX chains associated with the signal cancellation system can be calibrated online by injecting a test signal from the signal cancellation system's DAC towards the LNA and back in to the signal cancellation system's ADC, i.e. canceller LPBK mode. The FO signal estimation circuitry 310 downconverts the out-of-band signal that is output by the coupler 336 using the FO signal generated by DTC 315 as described with reference to DTC 215 in FIG. 2. The downconverted out-of-band signal $X_{FO}$ is then the signal that is demodulated during LPBK calibration.

Figure 4:
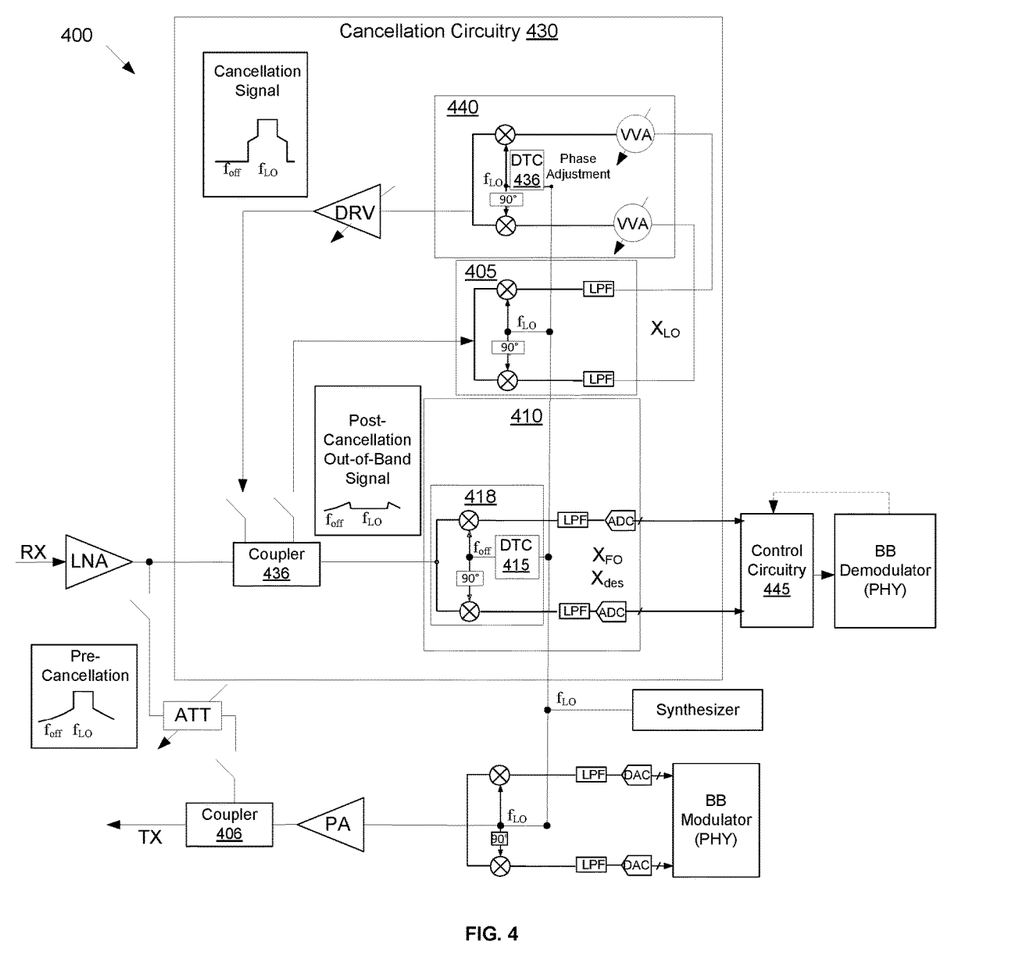
FIG. 4 illustrates an exemplary signal cancellation system that cancels a downconverted received signal from a received signal to generate an out-of-band signal during loopback aided calibration in accordance with various aspects described.

FIG. 4 illustrates a transceiver architecture 400 that includes an example signal cancellation system 400 for use during LBBK calibration. The signal cancellation system 400 functions in a similar manner as that described with reference to FIG. 3, however, the generation of the cancellation signal from the received signal is performed exclusively in the analog domain. The input signal looped back from the TX chain is shown as the "pre-cancellation" signal which has a significant signal component at the LO frequency and out-of-band signal components at the offset frequency. The signal cancellation system 400 includes LO downconverter circuitry 405, FO signal estimation circuitry 410, cancellation circuitry 430, and alignment circuitry 440. The cancellation circuitry 430 includes a coupler 436 that injects a cancellation signal output by the alignment circuitry 440 into the received signal to generate the out-of-band signal. The cancellation signal should be identical in magnitude and have inverted phase with respect to the received signal components at the LO frequency.

To generate the cancellation signal, the LO downconverter 405 downconverts the received signal using the LO signal to generate the downconverted received signal $X_{LO}$. The alignment circuitry 440 modifies the downconverted received signal $X_{LO}$ generated by the LO downconverter circuitry 305 to compensate for the effects the RX/TX chains associated with the signal cancellation system 300 cause in the received signal.

The alignment circuitry 440 adjusts the magnitude of the downconverted received signal $X_{LO}$ via BB/RF gain control. Fine gain control can be achieved by using a VVA (Voltage Variable Attenuator). The alignment circuitry 440 adjusts the phase of the estimated interference signal with a phase adjustment circuitry comprising a dedicated DTC block 436 that provides phase adjustment to achieve 180° phase compared to the interference signal at the injection point. Since the signal cancellation system is pure RF-analog, and only minimal filtration with low time delay is employed, the time delay is negligible, and therefore no time alignment (prediction) is required. In one example, the gain and phase adjustments are controlled by simple digital control circuitry 445 which searches for the optimum gain blocks and DTC block settings which provide the minimum LPBK energy in the presence of interference. The control circuitry can be implemented in the analog domain as well.

Figure 5:
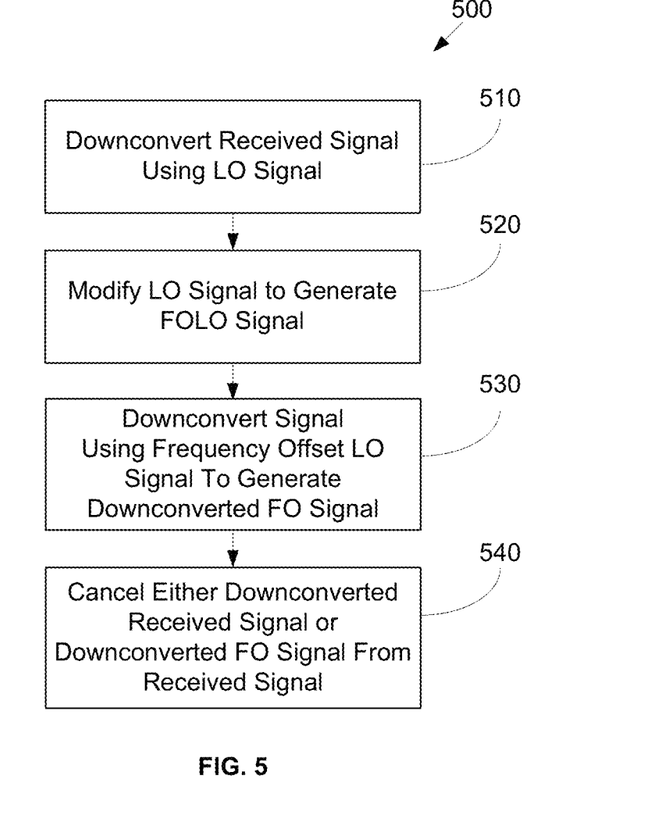
FIG. 5 illustrates a flow diagram of an exemplary method for generating a desired signal from a received signal in accordance with various aspects described.

FIG. 5 illustrates a flow diagram of an example method 500 to generate a desired signal from a received signal. The method 500 may be performed by the signal cancellation system 100, 200, 300, and/or 400 of FIGS. 1-4, respectively. At 510, the method includes downconverting the received signal using a local oscillator (LO) signal having an LO frequency to generate a downconverted received signal. At 520, the method includes modifying the LO signal to generate a frequency offset (FO) LO signal having an offset frequency that is different from the LO frequency. A signal derived from the received signal is downconverted using the FOLO signal to generate a downconverted FO signal at 530. At 540, the method includes cancelling either the downconverted received signal or the downconverted FO signal from the received signal to generate the desired signal.

It can be seen from the foregoing description that modifying an LO signal having a desired frequency to generate a frequency offset LO signal having an offset frequency and using the frequency offset LO signal to generate a frequency offset signal that can be used to generate a desired signal from a received signal provides effective interference cancellation without significant increase in footprint or power consumption.

Figure 6:
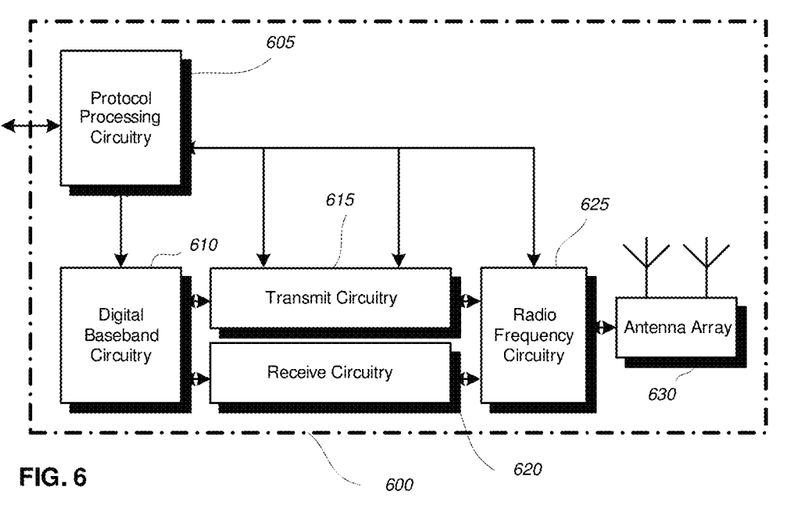
FIGS. 6 and 7 illustrate example communication devices that include signal cancellation system in accordance with various aspects described.

FIG. 6 illustrates an exemplary communication circuitry 600 according to some aspects. Circuitry 600 is alternatively grouped according to functions. Components as shown in 600 are shown here for illustrative purposes and may include other components not shown here in FIG. 6.

Communication circuitry 600 may include protocol processing circuitry 605, which may implement one or more of medium access control (MAC), radio link control (RLC), packet data convergence protocol (PDCP), radio resource control (RRC) and non-access stratum (NAS) functions.

Protocol processing circuitry 605 may include one or more processing cores (not shown) to execute instructions and one or more memory structures (not shown) to store program and data information.

Communication circuitry 600 may further include digital baseband circuitry 610, which may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Communication circuitry 600 may further include transmit circuitry 615, receive circuitry 620 and/or antenna array circuitry 630. The signal cancellation systems and circuitries described herein may be included in the transmit circuitry 615 and/or the receive circuitry 620. Communication circuitry 600 may further include radio frequency (RF) circuitry 625. In an aspect of the invention, RF circuitry 625 may include multiple parallel RF chains for one or more of transmit or receive functions, each connected to one or more antennas of the antenna array 630.

In an aspect of the disclosure, protocol processing circuitry 605 may include one or more instances of control circuitry (not shown) to provide control functions for one or more of digital baseband circuitry 610, transmit circuitry 615, receive circuitry 620, and/or radio frequency circuitry 625.

Figure 7:
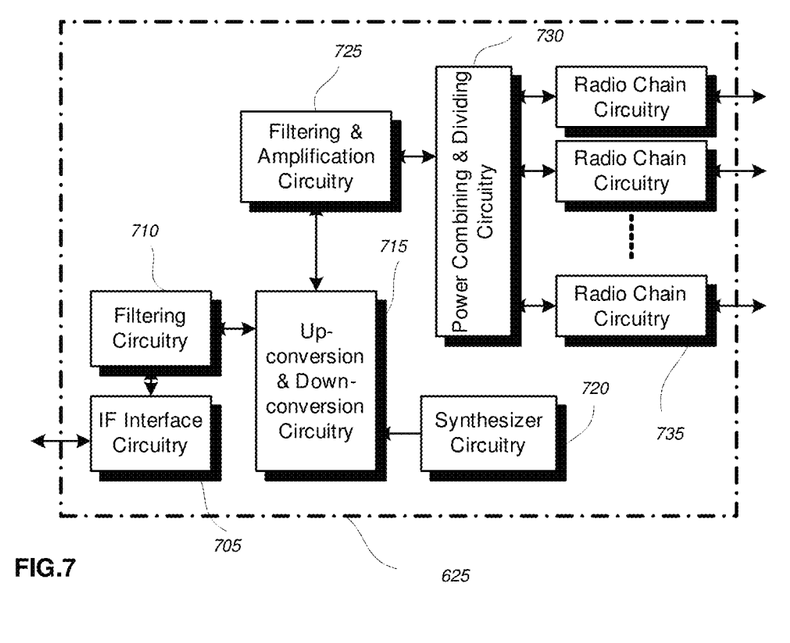

FIG. 7 illustrates RF circuitry 625 according to some aspects. In an aspect, RF circuitry 625 may include one or more of each of IF interface circuitry 705, filtering circuitry 710, upconversion and downconversion circuitry 715, synthesizer circuitry 720, filtering and amplification circuitry 725, power combining and dividing circuitry 730 and radio chain circuitry 735.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is a signal cancellation system configured to generate a desired signal from a received signal, including a local oscillator (LO) downconverter circuitry, a frequency offset (FO) signal estimation circuitry, and a cancellation circuitry. The LO downconverter circuitry is configured to downconvert the received signal using an LO signal having an LO frequency to generate a downconverted received signal. The FO signal estimation circuitry, includes a FOLO generation circuitry configured to modify the LO signal to generate a FOLO signal having an offset frequency that is different from the LO frequency and a FOLO downconverter circuitry configured to use the FOLO signal to downconvert a signal derived from the received signal to generate a downconverted FO signal. The cancellation circuitry is configured to cancel either the downconverted received signal or the downconverted FO signal from the received signal to generate the desired signal.

Example 2 includes the subject matter of example 1, including or omitting optional elements, wherein the FOLO generation circuitry includes a digital-to-time converter (DTC) configured to receive the LO signal and generate the FOLO signal in response to receiving a ramp DTC phase modulation input.

Example 3 includes the subject matter of example 1, including or omitting optional elements, wherein the received signal includes a desired signal component centered at the LO frequency and a blocker signal component at the offset frequency; the FOLO downconverter circuitry is configured to downconvert the received signal to generate the downconverted FO signal; and the cancellation circuitry is configured to subtract the downconverted FO signal from the downconverted received signal to generate the desired signal.

Example 4 includes the subject matter of example 3, including or omitting optional elements, wherein the cancellation circuitry is configured to convolve the FO signal with an estimated phase noise and subtract the convolution result from the downconverted received signal to generate the desired signal, and wherein the system further includes a phase noise estimation circuitry configured to determine the estimated phase noise. The phase noise estimation circuitry includes an evaluation circuitry configured to evaluate a quality of data symbols recovered from the desired signal output by the cancellation circuitry; a reconstruction circuitry configured to reconstruct a time domain received signal from the recovered data symbols; and a decision directed feedback circuitry. The decision directed feedback circuitry is configured to, until the quality of the data symbols reaches a threshold, estimate noise in the desired signal by subtracting the time domain received signal from the desired signal, calculate a subsequent estimated phase noise based at east on the estimated noise, and provide the subsequent estimated phase noise to the cancellation circuitry to generate a subsequent desired signal.

Example 5 includes the subject matter of example 1, including or omitting optional elements, wherein the received signal includes a transmit signal output by a transmit power amplifier looped back to a receive chain, and the cancellation circuitry is configured to cancel the downconverted received signal from the received signal to generate an out-of-band signal, and the FOLO downconverter circuitry is configured to downconvert the out-of-band signal using the FOLO signal to generate the downconverted FO signal, such that the downconverted FO signal is the desired signal.

Example 6 includes the subject matter of example 5, including or omitting optional elements, further including an alignment circuitry configured to receive the downconverted received signal; adjust the downconverted received signal to align the downconverted received signal in time with the received signal; upconvert the adjusted downconverted received signal using the LO signal; and provide the upconverted adjusted downconverted received signal to the cancellation circuitry to be subtracted from the received signal to generate the out-of-band signal.

Example 7 includes the subject matter of example 6, including or omitting optional elements, wherein the alignment circuitry includes a variable voltage attenuator (VVA) controlled by a VVA control signal to adjust a gain of the downconverted received signal; phase adjustment circuitry controlled by a phase adjustment control signal to adjust a phase of the downconverted received signal; and control circuitry configured to generate the VVA control signal and the phase adjustment control signal based at least on the out-of-band signal.

Example 8 includes the subject matter of example 7, including or omitting optional elements, wherein the phase adjustment circuitry includes a second DTC configured to shift a phase of the LO signal by 180 degrees.

Example 9 is a method configured to generate a desired signal from a received signal, including: downconverting the received signal using a local oscillator (LO) signal having an LO frequency to generate a downconverted received signal; modifying the LO signal to generate a frequency offset (FO) LO signal having an offset frequency that is different from the LO frequency; downconverting a signal derived from the received signal using the FOLO signal to generate a downconverted FO signal; and cancelling either the downconverted received signal or the downconverted FO signal from the received signal to generate the desired signal.

Example 10 includes the subject matter of example 9, including or omitting optional elements, wherein modifying the LO signal includes inputting the LO signal to a digital-to-time converter (DTC) and providing a ramp DTC phase modulation input to the DTC to generate the FOLO signal.

Example 11 includes the subject matter of example 9, including or omitting optional elements, wherein the received signal includes a desired signal component centered at the LO frequency and a blocker signal component at the offset frequency, the method further including cancelling the downconverted FO signal from the downconverted received signal to generate the desired signal.

Example 12 includes the subject matter of example 11, including or omitting optional elements, wherein cancelling the downconverted FO signal includes convolving the FO signal with an estimated phase noise and subtracting the convolution result from the downconverted received signal to generate the desired signal, and wherein the method further includes determining the estimated phase noise by: evaluating a quality of configured to estimate phase noise based at least on a quality of data symbols recovered from the desired signal output by a cancellation circuitry; reconstructing a time domain received signal from the recovered data symbols; and until the quality of the data symbols reaches a threshold, estimating noise in the desired signal by subtracting the time domain received signal from the desired signal. A subsequent estimated phase noise is calculated based at least on the estimated noise and the subsequent estimated phase noise is provided to the cancellation circuitry to generate a subsequent desired signal.

Example 13 includes the subject matter of example 9, including or omitting optional elements, wherein the received signal includes a transmit signal output by a transmit power amplifier looped back to a receive chain, the method further including: subtracting the downconverted received signal from the received signal to generate an out-of-band signal; and downconverting the out-of-band signal using the FOLO signal to generate the downconverted FO signal, wherein the downconverted FO signal is the desired signal.

Example 14 includes the subject matter of example 13, including or omitting optional elements, further including: receiving the downconverted received signal; adjusting the downconverted received signal to align the downconverted received signal in time with the received signal; upconverting the adjusted downconverted received signal using the LO signal; and cancelling the upconverted adjusted downconverted received signal from the received signal to generate the out-of-band signal.

Example 15 is a frequency offset (FO) signal estimation circuitry, including: a frequency offset local oscillator (FOLO) generation circuitry configured to modify a local oscillator (LO) signal having an LO frequency to generate a FOLO signal having an offset frequency that is different from the LO frequency; and a FOLO downconverter circuitry configured to use the FOLO signal to downconvert a signal to generate a downconverted FO signal, wherein the FO signal is used to generate a desired signal.

Example 16 includes the subject matter of example 15, including or omitting optional elements, wherein the FOLO generation circuitry includes a digital-to-time converter (DTC) configured to receive the LO signal and generate the FOLO signal in response to receiving a ramp DTC phase modulation input.

Example 17 includes the subject matter of example 15, including or omitting optional elements, wherein: the signal includes a desired signal component centered at the LO frequency and a blocker signal component at the offset frequency. The FOLO downconverter circuitry is configured to: downconvert the signal to generate the downconverted FO signal; and provide the downconverted FO signal to cancellation circuitry, wherein the cancellation circuitry is configured to subtract the downconverted FO signal from the downconverted signal to generate the desired signal.

Example 18 includes the subject matter of example 15, including or omitting optional elements, wherein the signal includes an out-of-band signal including a transmit signal output by a transmit power amplifier looped back to a receive chain from which a downconverted received signal has been cancelled. The FOLO downconverter circuitry is configured to downconvert the out-of-band signal using the FOLO signal to generate the downconverted FO signal, wherein the downconverted FO signal is the desired signal.

Example 19 is an apparatus configured to generate a desired signal from a received signal, including: means for downconverting the received signal using a local oscillator (LO) signal having an LO frequency to generate a downconverted received signal; means for modifying the LO signal to generate a frequency offset (FO) LO signal having an offset frequency that is different from the LO frequency; means for downconverting a signal derived from the received signal using the FOLO signal to generate a downconverted FO signal; and means for cancelling either the downconverted received signal or the downconverted FO signal from the received signal to generate the desired signal.

Example 20 includes the subject matter of example 19, including or omitting optional elements, wherein the means for modifying the LO signal includes a digital-to-time converter (DTC) configured to receive a ramp DTC phase modulation input.

Example 21 includes the subject matter of example 19, including or omitting optional elements, wherein the received signal includes a desired signal component centered at the LO frequency and a blocker signal component at the offset frequency, the apparatus further including means for cancelling the downconverted FO signal from the downconverted received signal to generate the desired signal.

Example 22 includes the subject matter of example 19, including or omitting optional elements, wherein the received signal includes a transmit signal output by a transmit power amplifier looped back to a receive chain. the apparatus further includes means for subtracting the downconverted received signal from the received signal to generate an out-of-band signal; and means for downconverting the out-of-band signal using the FOLO signal to generate the downconverted FO signal, wherein the downconverted FO signal is the desired signal.

It is to be understood that aspects described herein may be implemented by hardware, software, firmware, or any combination thereof. When implemented in software, functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration. Additionally, at least one processor may include one or more modules operable to perform one or more of the acts and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Further, the acts and/or actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the acts and/or actions of a method or algorithm may reside as one or any combination or set of codes and/or instructions on a machine-readable medium and/or computer readable medium, which may be incorporated into a computer program product.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A signal cancellation system configured to generate a desired signal from a received signal, comprising:
a local oscillator (LO) downconverter circuitry configured to downconvert the received signal using an LO signal having an LO frequency to generate a downconverted received signal;
a frequency offset (FO) signal estimation circuitry, comprising:
a FOLO generation circuitry configured to modify the LO signal to generate a FOLO signal having an offset frequency that is different from the LO frequency;
a FOLO downconverter circuitry configured to use the FOLO signal to downconvert a signal derived from the received signal to generate a downconverted FO signal; and
a cancellation circuitry configured to cancel either the downconverted received signal or the downconverted FO signal from the received signal to generate the desired signal.

2. The signal cancellation system of claim 1, wherein the FOLO generation circuitry comprises a digital-to-time converter (DTC) configured to receive the LO signal and generate the FOLO signal in response to receiving a ramp DTC phase modulation input.

3. The signal cancellation system of claim 1, wherein:
the received signal includes a desired signal component centered at the LO frequency and a blocker signal component at the offset frequency;
the FOLO downconverter circuitry is configured to downconvert the received signal to generate the downconverted FO signal; and
the cancellation circuitry is configured to subtract the downconverted FO signal from the downconverted received signal to generate the desired signal.

4. The signal cancellation system of claim 3, wherein:
the cancellation circuitry is configured to convolve the FO signal with an estimated phase noise and subtract the convolution result from the downconverted received signal to generate the desired signal, and
the system further comprises a phase noise estimation circuitry configured to determine the estimated phase noise, the phase noise estimation circuitry comprising:

an evaluation circuitry configured to evaluate a quality of data symbols recovered from the desired signal output by the cancellation circuitry;
a reconstruction circuitry configured to reconstruct a time domain received signal from the recovered data symbols; and
a decision directed feedback circuitry configured to, until the quality of the data symbols reaches a threshold:
estimate noise in the desired signal by subtracting the time domain received signal from the desired signal; and
calculate a subsequent estimated phase noise based at least on the estimated noise; and
provide the subsequent estimated phase noise to the cancellation circuitry to generate a subsequent desired signal.

5. The signal cancellation system of claim 1, wherein:
the received signal comprises a transmit signal output by a transmit power amplifier looped back to a receive chain; and
the cancellation circuitry is configured to cancel the downconverted received signal from the received signal to generate an out-of-band signal; and
the FOLO downconverter circuitry is configured to downconvert the out-of-band signal using the FOLO signal to generate the downconverted FO signal,
wherein the downconverted FO signal is the desired signal.

6. The signal cancellation system of claim 5, further comprising an alignment circuitry configured to:
receive the downconverted received signal;
adjust the downconverted received signal to align the downconverted received signal in time with the received signal;
upconvert the adjusted downconverted received signal using the LO signal; and
provide the upconverted adjusted downconverted received signal to the cancellation circuitry to be subtracted from the received signal to generate the out-of-band signal.

7. The signal cancellation system of claim 6, wherein the alignment circuitry comprises:
a variable voltage attenuator (VVA) controlled by a VVA control signal to adjust a gain of the downconverted received signal;
phase adjustment circuitry controlled by a phase adjustment control signal to adjust a phase of the downconverted received signal; and
control circuitry configured to generate the VVA control signal and the phase adjustment control signal based at least on the out-of-band signal.

8. The signal cancellation system of claim 7, wherein the phase adjustment circuitry comprises a second DTC configured to shift a phase of the LO signal by 180 degrees.

9. A method configured to generate a desired signal from a received signal, comprising:
downconverting the received signal using a local oscillator (LO) signal having an LO frequency to generate a downconverted received signal;
modifying the LO signal to generate a frequency offset (FO) LO signal having an offset frequency that is different from the LO frequency;
downconverting a signal derived from the received signal using the FOLO signal to generate a downconverted FO signal; and
cancelling either the downconverted received signal or the downconverted FO signal from the received signal to generate the desired signal.

10. The method of claim 9, wherein modifying the LO signal comprises inputting the LO signal to a digital-to-time converter (DTC) and providing a ramp DTC phase modulation input to the DTC to generate the FOLO signal.

11. The method of claim 9, wherein the received signal includes a desired signal component centered at the LO frequency and a blocker signal component at the offset frequency, the method further comprising cancelling the downconverted FO signal from the downconverted received signal to generate the desired signal.

12. The method of claim 11, wherein cancelling the downconverted FO signal comprises convolving the FO signal with an estimated phase noise and subtracting the convolution result from the downconverted received signal to generate the desired signal, and wherein the method further comprises determining the estimated phase noise by:
evaluating a quality of configured to estimate phase noise based at least on a quality of data symbols recovered from the desired signal output by a cancellation circuitry;
reconstructing a time domain received signal from the recovered data symbols; and
until the quality of the data symbols reaches a threshold:
estimating noise in the desired signal by subtracting the time domain received signal from the desired signal; and
calculating a subsequent estimated phase noise based at least on the estimated noise; and
providing the subsequent estimated phase noise to the cancellation circuitry to generate a subsequent desired signal.

13. The method of claim 9, wherein the received signal comprises a transmit signal output by a transmit power amplifier looped back to a receive chain, the method further comprising:
subtracting the downconverted received signal from the received signal to generate an out-of-band signal; and
downconverting the out-of-band signal using the FOLO signal to generate the downconverted FO signal,
wherein the downconverted FO signal is the desired signal.

14. The method of claim 13, further comprising:
receiving the downconverted received signal;
adjusting the downconverted received signal to align the downconverted received signal in time with the received signal;
upconverting the adjusted downconverted received signal using the LO signal; and
cancelling the upconverted adjusted downconverted received signal from the received signal to generate the out-of-band signal.

15. A frequency offset (FO) signal estimation circuitry, comprising:
a frequency offset local oscillator (FOLO) generation circuitry configured to modify a local oscillator (LO) signal having an LO frequency to generate a FOLO signal having an offset frequency that is different from the LO frequency; and
a FOLO downconverter circuitry configured to use the FOLO signal to downconvert a signal to generate a downconverted FO signal, wherein the downconverted FO signal is used to generate a desired signal, wherein the signal comprises a desired signal component centered at the LO frequency and a blocker signal component at the offset frequency, and the FOLO downconverter circuitry is configured to downconvert the signal to generate the downconverted FO signal and provide the downconverted FO signal to cancellation circuitry, wherein the cancellation circuitry is configured to subtract the downconverted FO signal from the downconverted signal to generate the desired signal, or the signal comprises an out-of-band signal comprising a transmit signal output by a transmit power amplifier looped back to a receive chain from which a downconverted received signal has been cancelled, and the FOLO downconverter circuitry is configured to downconvert the out-of-band signal using the FOLO signal to generate the downconverted FO signal, wherein the downconverted FO signal is the desired signal.

16. The FO signal estimation circuitry of claim 15, wherein the FOLO generation circuitry comprises a digital-to-time converter (DTC) configured to receive the LO signal and generate the FOLO signal in response to receiving a ramp DTC phase modulation input.

* * * * *